(12) United States Patent
Yoon et al.

(10) Patent No.: US 10,279,685 B2
(45) Date of Patent: May 7, 2019

(54) BATTERY CONTROL SYSTEM AND METHOD FOR DETECTING FUSION OF RELAY

(71) Applicant: HYUNDAI MOTOR COMPANY, Seoul (KR)

(72) Inventors: Jong Hu Yoon, Jeollanam-do (KR); Mi Ok Kim, Seongnam-si (KR); Beom Gyu Kim, Hwaseong-si (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 273 days.

(21) Appl. No.: 15/219,960

(22) Filed: Jul. 26, 2016

(65) Prior Publication Data

US 2017/0120754 A1 May 4, 2017

(30) Foreign Application Priority Data

Nov. 3, 2015 (KR) .................. 10-2015-0154094

(51) Int. Cl.
*B60L 3/04* (2006.01)
*B60L 3/00* (2019.01)
(Continued)

(52) U.S. Cl.
CPC .............. *B60L 3/04* (2013.01); *B60L 3/0023* (2013.01); *B60L 3/0069* (2013.01); *B60L 3/12* (2013.01);
(Continued)

(58) Field of Classification Search
USPC ................. 307/9.1; 320/103, 104, 139–141
See application file for complete search history.

(56) References Cited

U.S. PATENT DOCUMENTS 6,246,831 B1 * 6/2001 Seitz .................. F24H 9/2021
219/483
9,145,057 B2 * 9/2015 Jung ...................... B60L 1/003
(Continued)

FOREIGN PATENT DOCUMENTS

JP 2015133855 A 7/2015
KR 10-1241226 B1 3/2013
(Continued)

OTHER PUBLICATIONS

Office Action in corresponding Korean Patent Application No. 10-2015-0154094, dated Aug. 17, 2017.

*Primary Examiner* — Adam D Houston
(74) *Attorney, Agent, or Firm* — Morgan Lewis & Bockius LLP

(57) ABSTRACT

A battery control system includes a main battery and an auxiliary battery, a direct current DC-DC converter for converting a high voltage output from the main battery into a low voltage between the main battery and the auxiliary battery and supplying the converted low voltage to the auxiliary battery or an electronic load, a relay for intermitting a voltage of the auxiliary battery, and a battery management system for controlling the relay to be turned off in a state in which the DC-DC converter is operated in a constantly ON state, comparing an output voltage of the DC-DC converter and a summation of cell voltages of the auxiliary battery, and detecting a fusion state of the relay according to a comparison result.

15 Claims, 7 Drawing Sheets

(51) Int. Cl.
  G01R 31/327 (2006.01)
  B60L 3/12 (2006.01)
  B60L 11/18 (2006.01)
  G01R 31/00 (2006.01)
  G01R 31/02 (2006.01)

(52) U.S. Cl.
  CPC ...... B60L 11/1864 (2013.01); G01R 31/3278 (2013.01); *B60L 2210/10* (2013.01); *B60L 2240/527* (2013.01); *B60L 2240/547* (2013.01); *B60L 2240/549* (2013.01); *B60L 2250/10* (2013.01); *B60L 2250/16* (2013.01); *G01R 31/007* (2013.01); *G01R 31/025* (2013.01); *Y02T 10/7005* (2013.01); *Y02T 10/7061* (2013.01); *Y02T 10/7216* (2013.01)

(56) References Cited

U.S. PATENT DOCUMENTS

| | | | | |
|---|---|---|---|---|
| 9,630,512 | B2* | 4/2017 | Yoon | B60L 11/1803 |
| 9,726,725 | B2* | 8/2017 | Wakida | G01R 31/327 |
| 9,802,558 | B2* | 10/2017 | Namou | B60L 11/1851 |
| 9,931,958 | B2* | 4/2018 | Yoon | H02J 7/0013 |
| 2004/0047097 | A1* | 3/2004 | Thomas Jordan | G01R 31/3278 361/92 |
| 2011/0279082 | A1* | 11/2011 | Hagenmaier, Jr. | B60L 11/1824 320/109 |
| 2012/0150382 | A1* | 6/2012 | Bucci | B60L 11/005 701/29.6 |
| 2013/0106423 | A1* | 5/2013 | Moon | H02H 3/044 324/418 |
| 2014/0217814 | A1* | 8/2014 | Namou | B60L 11/00 307/10.1 |
| 2015/0115966 | A1* | 4/2015 | Berman | B60L 3/0023 324/418 |
| 2015/0300308 | A1* | 10/2015 | Mori | F02D 29/02 701/22 |
| 2016/0093927 | A1* | 3/2016 | Marcicki | H01M 10/0525 429/50 |
| 2016/0094056 | A1* | 3/2016 | Dulle | H02J 7/007 320/126 |
| 2016/0229309 | A1* | 8/2016 | Mitsutani | B60L 3/0084 |
| 2016/0264126 | A1* | 9/2016 | Ketfi-Cherif | B60L 1/003 |
| 2016/0303976 | A1* | 10/2016 | Cha | B60L 3/0046 |
| 2016/0325635 | A1* | 11/2016 | Masuda | B60L 11/1818 |
| 2016/0325636 | A1* | 11/2016 | Masuda | B60L 11/1853 |
| 2017/0066336 | A1* | 3/2017 | Okamoto | B60L 11/182 |
| 2017/0110975 | A1* | 4/2017 | Nishi | B60L 11/1868 |
| 2017/0120754 | A1* | 5/2017 | Yoon | B60L 3/0023 |
| 2017/0136913 | A1* | 5/2017 | Yang | B60L 11/1811 |
| 2017/0144549 | A1* | 5/2017 | Park | B60L 1/003 |
| 2017/0158078 | A1* | 6/2017 | Kim | B60L 11/1861 |
| 2017/0203656 | A1* | 7/2017 | Okamoto | B60L 11/182 |
| 2017/0214254 | A1* | 7/2017 | Kubo | B60L 11/18 |
| 2017/0217303 | A1* | 8/2017 | Widek | B60K 6/52 |
| 2017/0267102 | A1* | 9/2017 | Hori | B60L 3/0046 |
| 2017/0352203 | A1* | 12/2017 | Jansson | B60L 3/0061 |
| 2018/0005788 | A1* | 1/2018 | Pullmann | G05B 9/03 |
| 2018/0043847 | A1* | 2/2018 | Burkman | B60L 1/00 |
| 2018/0072308 | A1* | 3/2018 | Miyaishi | B60K 6/48 |
| 2018/0099578 | A1* | 4/2018 | Lee | B60L 11/1861 |
| 2018/0105060 | A1* | 4/2018 | McQuillen | B60L 11/1844 |
| 2018/0106367 | A1* | 4/2018 | Mouri | B60K 6/442 |
| 2018/0111483 | A1* | 4/2018 | Nakayama | B60K 1/04 |
| 2018/0123449 | A1* | 5/2018 | Nakamura | H02M 1/38 |
| 2018/0131205 | A1* | 5/2018 | Jin | A47L 9/2805 |
| 2018/0138486 | A1* | 5/2018 | Wyatt | B60L 11/1868 |
| 2018/0170362 | A1* | 6/2018 | Choi | B60K 6/485 |
| 2018/0244258 | A1* | 8/2018 | Mouri | B60K 6/543 |
| 2018/0297465 | A1* | 10/2018 | Miyaishi | F16H 61/36 |

FOREIGN PATENT DOCUMENTS

| | | |
|---|---|---|
| KR | 10-2013-0126146 A | 11/2013 |
| KR | 10-1470254 B1 | 12/2014 |
| KR | 10-2015-0047367 A | 5/2015 |
| KR | 10-20150077820 A | 7/2015 |

* cited by examiner

BATTERY CONTROL SYSTEM AND METHOD FOR DETECTING FUSION OF RELAY

CROSS-REFERENCE TO RELATED APPLICATION

This application claims the benefit of priority to Korean Patent Application No. 10-2015-0154094, filed on Nov. 3, 2015 with the Korean Intellectual Property Office, the disclosure of which is incorporated herein in its entirety by reference.

TECHNICAL FIELD

The present disclosure relates to a battery control system for a vehicle and a method for detecting a fusion of a relay.

BACKGROUND

An eco-friendly car such as an electric car or a hybrid vehicle is mounted with a battery for supplying driving power of an electric motor, which is a driving source of a vehicle, and a battery management system (BMS) that monitors a state of the battery.

The eco-friendly car includes a main battery that supplies a driving voltage to a driving unit of the vehicle such as a motor, and an auxiliary battery which is charged during driving of the vehicle and supplies a voltage to electronic components of the vehicle at the time of starting the vehicle, or supplies a voltage required to operate a main relay of the main battery.

In the auxiliary battery, a current is intermitted by a relay. In the case in which an over-current flows in the relay according to a road of the vehicle when the auxiliary battery is charged, a phenomenon that the relay is fused may occur. As such, when the relay is fused, the auxiliary battery may be over-discharged. In this case, the auxiliary battery enters an over-discharged state, thereby causing the auxiliary battery to be damaged, or no longer available.

SUMMARY

The present disclosure has been made to solve the above-mentioned problems occurring in the prior art while advantages achieved by the prior art are maintained intact.

An aspect of the present disclosure provides an apparatus and method for detecting a fusion of a relay capable of detecting the fusion of the relay by comparing an output voltage of a direct current DC-DC converter at the time of starting on or off a vehicle and a summation of cell voltages of a lithium battery of 12V.

According to an exemplary embodiment of the present disclosure, a battery control system includes a main battery and an auxiliary battery; a direct current DC-DC converter for converting a high voltage output from the main battery into a low voltage between the main battery and the auxiliary battery and supplying the converted low voltage to the auxiliary battery or an electronic load; a relay for intermitting a voltage of the auxiliary battery; and a battery management system for controlling the relay to be turned off in a state in which the DC-DC converter is operated in a constantly ON state, comparing an output voltage of the DC-DC converter and a summation of cell voltages of the auxiliary battery, and detecting a fusion state of the relay according to the comparison result.

According to another exemplary embodiment of the present disclosure, a method for detecting a fusion of a relay includes controlling the relay intermitting a voltage of an auxiliary battery to be turned off in a state in which a direct current DC-DC converter supplying a voltage to the auxiliary battery or an electronic load is operated in a constantly ON state; comparing an output voltage of the DC-DC converter and a summation of cell voltages of the auxiliary battery; and detecting a fusion state of the relay according to a comparison result.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
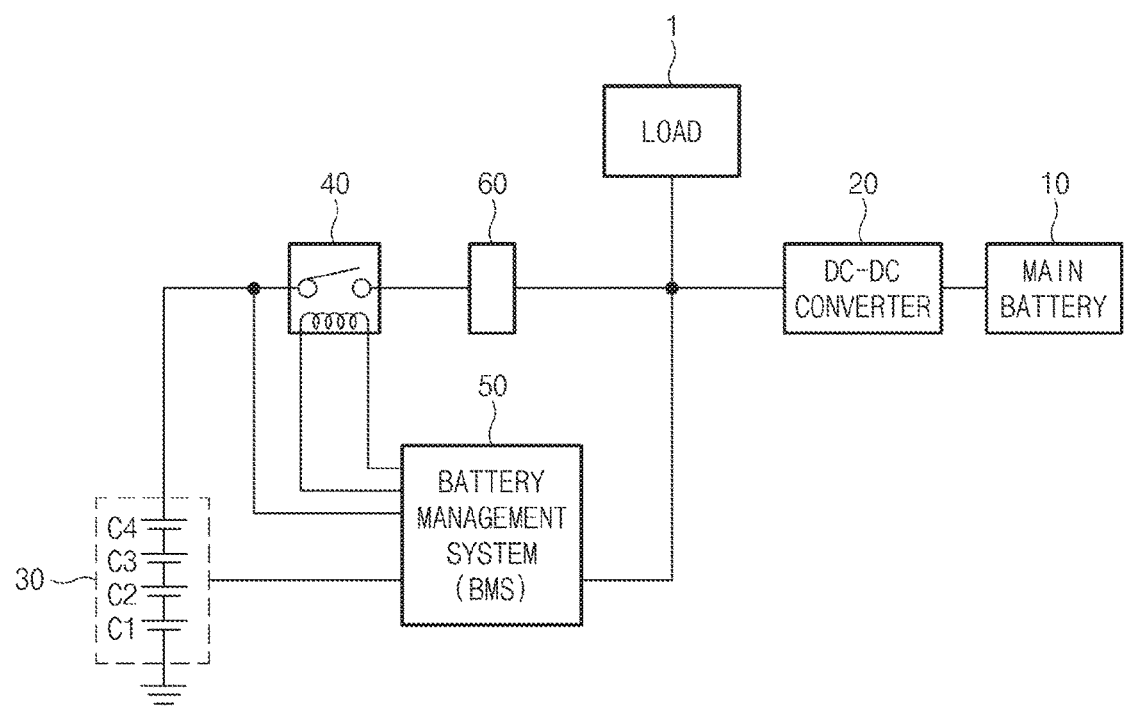
FIG. 1 is a diagram illustrating a configuration of an apparatus for detecting a fusion of a relay according to an exemplary embodiment of the present disclosure.

It is to be noted that technical terms used in the specification are used for describing specific embodiments and do not limit the present disclosure. In addition, unless indicated otherwise in the present disclosure, it is to be understood that all technical terms used in the present disclosure are construed is meaning as those that are generally understood by those skilled in the art and are not construed as excessively comprehensive meanings and excessively limiting meanings. In addition, when the technical terms used in the present disclosure are technical terms that do not accurately indicate the technical spirit of the present disclosure, it is to be understood that the terms be replaced with the technical terms understood by those skilled in the art. Further, the general terms used in the present disclosure must be understood according to the meanings defined by a conventional dictionary or the surrounding context, and should not form excessively limiting meanings.

Hereinafter, exemplary embodiments of the present disclosure will be described in more detail with reference to the accompanying drawings. The same reference numerals will be used to describe the same or like components, independent of the reference numerals and an overlapping description of the same components will be omitted.

Further, when it is determined that a detailed description of the known art related to the present disclosure may obscure concepts of the present disclosure, a detailed description thereof will be omitted. In addition, it is to be noted that the accompanying drawings are provided only in order to allow the spirit of the present disclosure to be easily understood, and are not to be interpreted as limiting the spirit of the present disclosure.

FIG. 1 is a diagram illustrating a configuration of a battery control system according to an exemplary embodiment of the present disclosure.

Accordingly, referring to FIG. 1, a battery control system according to the present disclosure may include a main battery 10, a direct current (DC)-DC converter 20, an auxiliary battery 30, a relay 40 and a battery management system (BMS) 50. In addition, the battery control system may further include a current sensor 60 that detects a current applied to the relay 40.

The main battery 10 may be a high voltage battery that supplies a driving voltage to a driving unit of a vehicle such as a motor. The main battery 10 may be charged by regeneration energy and/or an engine operation of the vehicle.

The main battery 10 may be connected to the DC-DC converter 20 and output a high voltage to the DC-DC converter 20. A main relay may be further provided between the main battery 10 and the DC-DC converter 20, but is not illustrated in FIG. 1.

The DC-DC converter 20 may rectify a DC voltage output from the main battery 10 to be converted into a low voltage, for example, a voltage of 12V. Here, the DC-DC converter 20 supplies the converted low voltage as a charging voltage of the auxiliary battery 30, or supplies the converted low voltage to an electronic load 1. Here, the DC-DC converter 20 may be connected in series between the main battery 10 and the auxiliary battery 30.

The auxiliary battery 30 may be a lithium battery of 12V including a plurality of cells. Here, in a case in which the charging voltage of the auxiliary battery 30 becomes a predetermined voltage or less, the auxiliary battery 30 may be supplied with the low voltage output from the DC-DC converter 20 and charge a plurality of cell voltages. Here, the auxiliary battery 30 may supply the charged DC voltage to electronic components of the vehicle at a time of starting the vehicle. In addition, the auxiliary battery 30 may also supply a voltage required to operate a main relay of the main battery 10.

The relay 40 for preventing an over-discharge of the auxiliary battery 30 may be disposed between the auxiliary battery 30 and the DC-DC converter 20.

In the case in which the charging voltage output from the DC-DC converter 20 is supplied to the auxiliary battery 30 or in the case in which the voltage output from the auxiliary battery 30 is supplied to the electronic load 1, the relay 40 may become an ON state. However, in other cases, the relay 40 may become an OFF state.

The relay 40 may be controlled by the battery management system (BMS) 50. The battery management system (BMS) 50 may detect a temperature, a voltage, a current, a state of charge, and the like of the battery, to manage or monitor a state of the battery. In addition, the battery management system (BMS) 50 may control ON/OFF of the relay 40 depending on the state of the battery.

In the case in which an over-current is applied to the relay 40, a fusion phenomenon may occur in the relay 40. In this case, although the battery management system (BMS) 50 performs an off control for the relay 40, the relay 40 maintains the ON state, thereby causing the charging voltage of the auxiliary battery 30 to be discharged. An exemplary embodiment of the case in which the relay 40 is fused will be described with reference to FIGS. 2 and 3.

Figure 2:
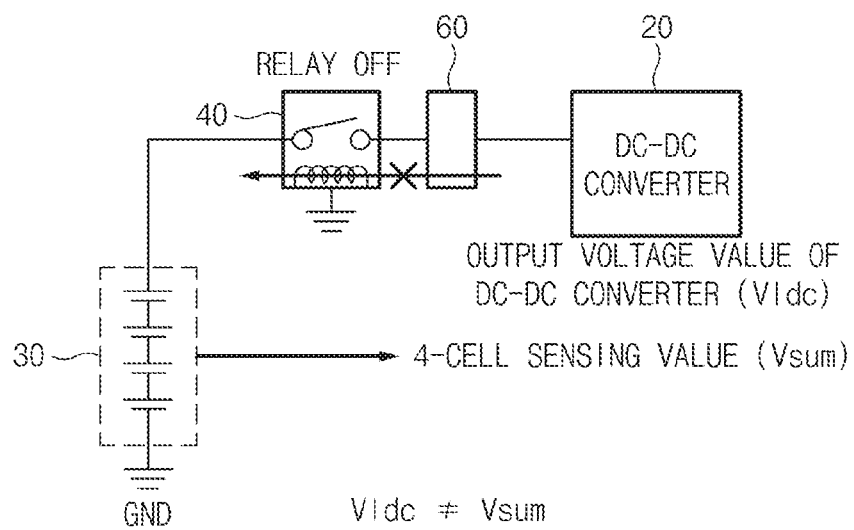
FIGS. 2 and 3 are diagrams illustrating an operation of detecting a fusion of a relay of the apparatus for detecting a fusion of a relay according to an exemplary embodiment of the present disclosure.

As illustrated in FIG. 2, in the case in which the relay 40 is normally operated, when the relay 40 is controlled to be turned off, an output terminal of the DC-DC converter 20 and an input terminal of the auxiliary battery 30 are electrically separated. As a result, a difference between an output voltage Vldc of the DC-DC converter 20 and a summation Vsum of the respective cell voltages of the auxiliary battery 30 occurs.

Figure 3:
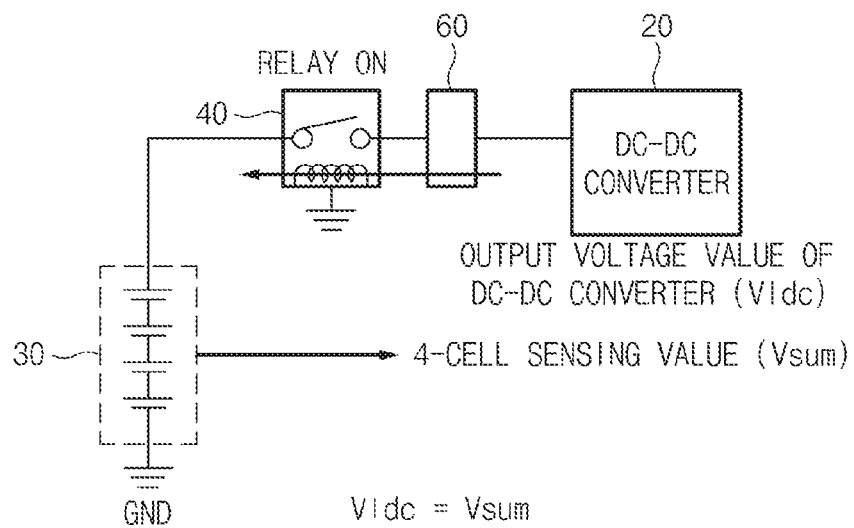

Meanwhile, as illustrated in FIG. 3, in the case in which the relay 40 is fused, even though the relay 40 is controlled to be turned off, the output terminal of the DC-DC converter 20 and the input terminal of the auxiliary battery 30 are electrically connected. As a result, the output voltage Vldc of the DC-DC converter 20 and the summation Vsum of the respective cell voltages of the auxiliary battery 30 have the same voltages.

Using this, the battery management system (BMS) 50 may perform a process of detecting the fusion of the relay 40 in an on or off state. Here, the battery management system (BMS) 50 may determine whether or not the relay 40 is fused by detecting the cell voltages of the auxiliary battery 30 and comparing the summation Vsum of the respective cell voltages and the output voltage Vldc of the DC-DC converter 20.

As an example, in the case in which the battery management system (BMS) 50 performs a process of detecting the fusion of the relay 40 in a state in which the vehicle is driving, the battery management system (BMS) 50 may transmit and receive a control signal to and from the DC-DC converter 20 over a controller area network (CAN) communication. Here, the battery management system (BMS) 50 may transmit a cooperation control request to the DC-DC converter 20 to prevent the DC-DC converter 20 from being entered into a burst mode during the process of detecting the fusion of the relay 40. Here, the output voltage Vldc of the DC-DC converter 20 may be supplied to the electronic load 1.

While the DC-DC converter 20 is operated in a constantly ON state, the battery management system (BMS) 50 may control the relay 40 to be turned off. In the state in which the relay 40 is turned off, the battery management system (BMS) 50 may compare the summation Vsum of the respective cell voltages of the auxiliary battery 30 and the output voltage Vldc of the DC-DC converter 20.

Here, if the summation Vsum of the respective cell voltages and the output voltage Vldc of the DC-DC converter 20 are equal to each other, the battery management system (BMS) 50 may determine that the fusion has occurred in the relay 40.

Meanwhile, if the summation Vsum of the respective cell voltages and the output voltage Vldc of the DC-DC converter 20 are not equal to each other, the battery management system (BMS) 50 may control, or compare, the output voltage Vldc of the DC-DC converter 20 to a secondary output voltage Vldc2 and then again secondarily compare a summation Vsum2 of the respective cell voltages of the auxiliary battery 30 and the secondary output voltage Vldc2 of the DC-DC converter 20. Here, the battery management system (BMS) 50 may perform a control so that the secondary output voltage Vldc2 of the DC-DC converter 20 has a voltage larger than the initial output voltage Vldc of the DC-DC converter 20.

If the secondary comparison result shows that the summation Vsum2 of the respective cell voltages and the secondary output voltage Vldc2 of the DC-DC converter 20 are not equal to each other, the battery management system (BMS) 50 may determine that the relay 40 is normal. On the other hand, if the secondary comparison result shows that the summation Vsum2 of the respective cell voltages and the secondary output voltage Vldc2 of the DC-DC converter 20 are equal to each other, the battery management system (BMS) 50 may determine that the fusion has occurred in the relay 40.

If it is confirmed that the relay 40 is normal when the process of detecting the fusion of the relay 40 ends, the battery management system (BMS) 50 may control the relay 40 to be turned on, and transmit a control signal to the DC-DC converter 20 over the CAN communication to release the cooperation control.

If it is confirmed that the fusion has occurred in the relay 40 when the process of detecting the fusion of the relay 40 ends, the battery management system (BMS) 50 may control the output voltage Vldc of the DC-DC converter 20 so that the SOC of the auxiliary battery 30 becomes a high state during driving of the vehicle. In addition, when the vehicle completes the driving and enters the starting off, or the off state, the battery management system (BMS) 50 may output a warning message using an output means included in the vehicle to allow a driver to recognize a fusion state of the relay 40, and may control the relay 40 to be turned on.

As another example, in the case in which the battery management system (BMS) 50 performs the process of detecting the fusion of the relay 40 in the operation in which the vehicle enters the starting off, or the off state, the battery management system (BMS) 50 may transmit and receive the control signal to and from the DC-DC converter 20 over a controller area network (CAN) communication. Here, the battery management system (BMS) 50 may transmit a cooperation control request to the DC-DC converter 20 to prevent the DC-DC converter 20 from being entered into a burst mode during the process of detecting the fusion of the relay 40. Here, the battery management system (BMS) 50 may allow a main relay (hereinafter, referred to as 'first relay') connected to the main battery 10 to also maintain an ON state until the corresponding process ends. Here, the output voltage Vldc of the DC-DC converter 20 may be supplied to the electronic load 1.

While a first relay and the DC-DC converter 20 are operated in a constantly ON state, the battery management system (BMS) 50 may control a relay (hereinafter, referral to as 'second relay') 40 to be turned off. In the state in which the second relay 40 is turned off, the battery management system (BMS) 50 may compare the summation Vsum of the respective cell voltages of the auxiliary battery 30 and the output voltage Vldc of the DC-DC converter 20.

Here, if the summation Vsum of the respective cell voltages and the output voltage Vldc of the DC-DC converter 20 are equal to each other, the battery management system (BMS) 50 may determine that the fusion has occurred in the second relay 40. Meanwhile, if the summation Vsum of the respective cell voltages and the output voltage Vldc of the DC-DC converter 20 are not equal to each other, the battery management system (BMS) 50 may determine that the second relay 40 is normal.

If it is confirmed that the second relay 40 is normal when the process of detecting the fusion of the relay 40 ends, the battery management system (BMS) 50 may control the second relay 40 to be turned on. Further, the battery management system (BMS) 50 may transmit a control signal to the DC-DC converter 20 over the CAN communication to release the cooperation control, and control the first relay to be also turned off.

If it is confirmed that the fusion has occurred in the second relay 40 when the process of detecting the fusion of the relay 40 ends, the battery management system (BMS) 50 may control the output voltage Vldc of the DC-DC converter 20 so that the SOC of the auxiliary battery 30 becomes a high state during driving of the vehicle. Further, the battery management system (BMS) 50 may output a warning message using an output means included in the vehicle to allow a driver to recognize a fusion state of the second relay 40. Then, the battery management system (BMS) 50 may release the cooperation control of the DC-DC converter 20 and control the DC-DC converter 20 and the first relay to be turned off.

Meanwhile, the apparatus for detecting a fusion of a relay according to the present disclosure may further include an output (not illustrated) that outputs an operation state, a result, and the like of the corresponding apparatus. Here, the output may include a display, and may also include a voice, or sound, output means such as a speaker.

The operation state, the result, and the like of the apparatus for detecting a fusion of a relay may also be transmitted and output to a display, an instrument panel, a dash board, a speaker, and/or the like included in the vehicle through a communicator (not illustrated) that performs vehicle network communication.

The communicator may include a communication module that supports a communication interface with electronic components and/or control units included in the vehicle. As an example, the communication module may be connected to a unit that manages a start on state, or an ignition state, of the vehicle to receive a start on state. Further, the communication module may be connected to LDC and may transmit and receive a signal for a cooperation control with the LDC at the time of detecting the fusion of the relay.

Here, the communicator may include the communication module that supports vehicle network communication such as controller area network (CAN) communication, local interconnect network (LIN) communication, flexray communication, and the like.

Further, the apparatus for detecting a fusion of a relay may include a storage (not illustrated) in which data and an algorithm required to operate the corresponding apparatus are stored. Here, the storage may store condition information for determining the fusion of the relay by the battery management system (BMS) 50 and instructions for controlling the respective units to determine the fusion of the relay. Further, the storage may also store an algorithm that determines the fusion of the relay using input data.

Here, the storage may include one or more storage medium such as a random access memory (RAM), a static random access memory (SRAM), a read-only memory (ROM), a programmable read-only memory (PROM), and an electrically erasable programmable read-only memory (EEPROM).

Operation flows of an apparatus according to embodiments of the present disclosure having the configuration as described above will be described below in detail.

FIGS. 4 to 7 are flowcharts illustrating operation flows of methods for detecting a fusion of a relay according to exemplary embodiments of the present disclosure.

Figure 4:
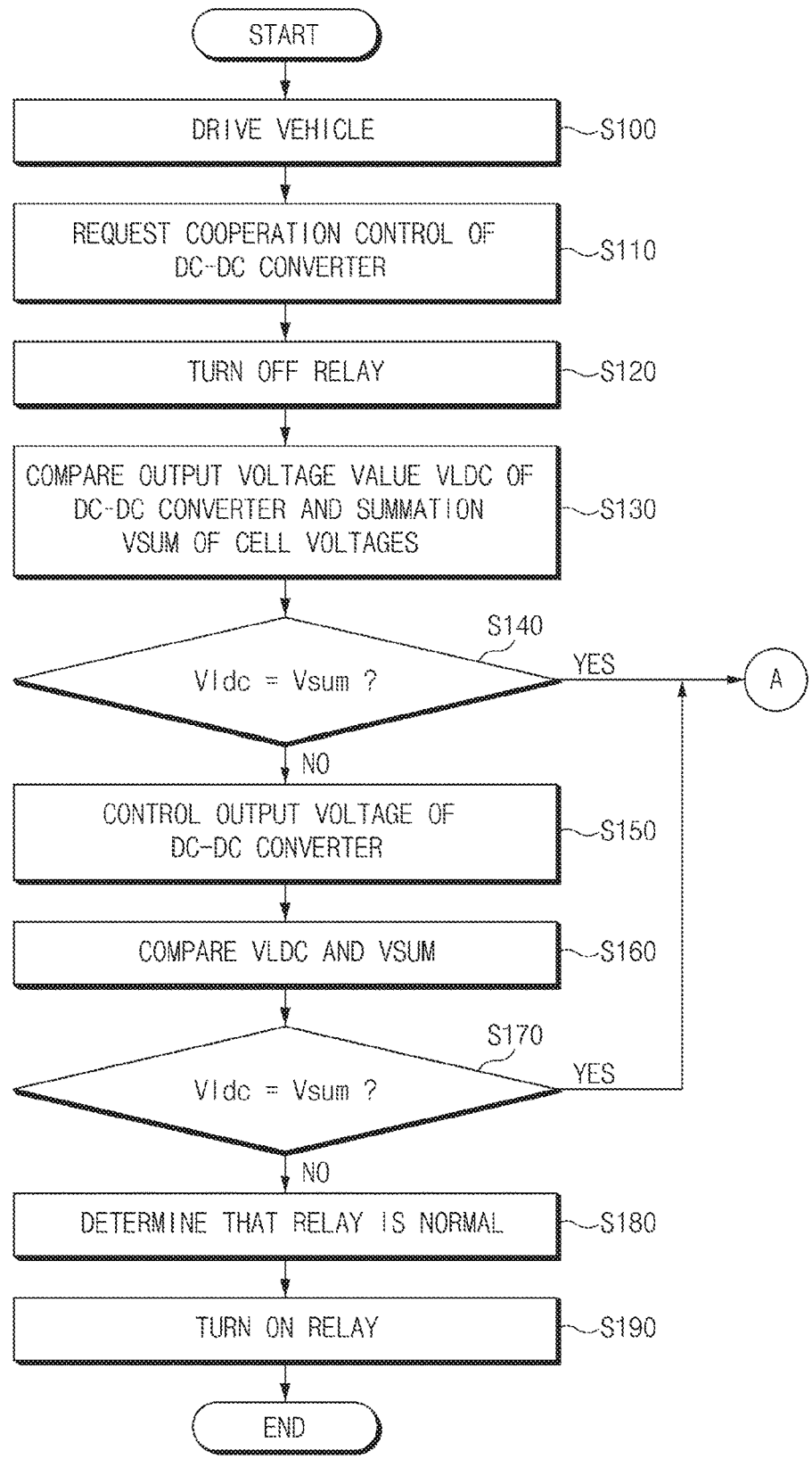
FIGS. 4 to 7 are flowcharts illustrating operation flows of methods for detecting a fusion of a relay according to exemplary embodiments of the present disclosure.
Figure 5:
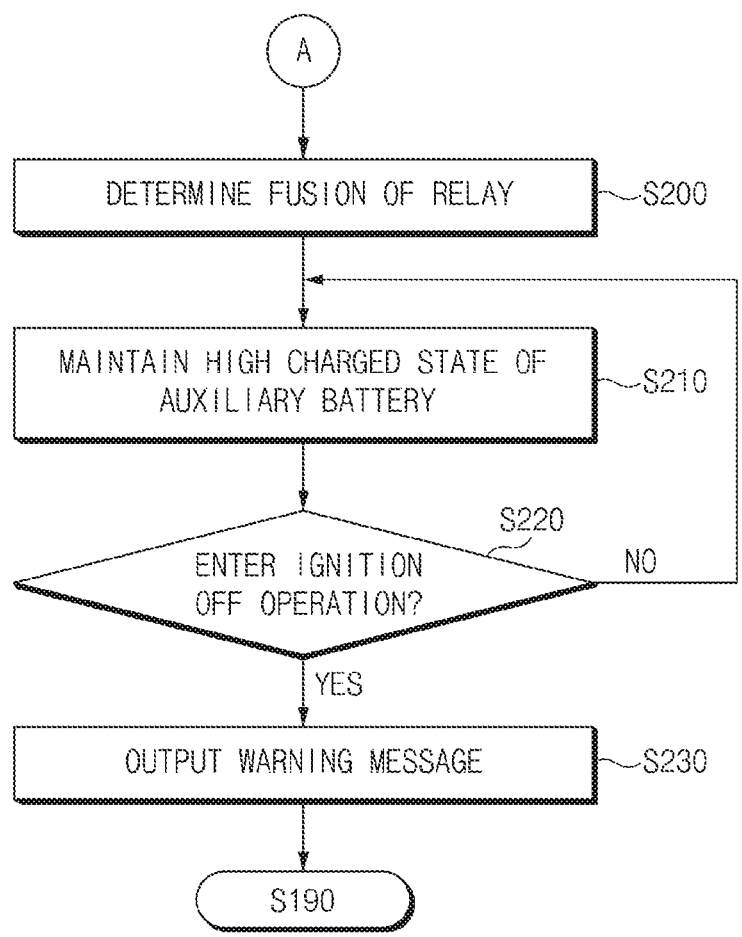

FIGS. 4 and 5 illustrate an operation of detecting a fusion of a relay in a state in which a vehicle is driving.

Referring to FIGS. 4 and 5, a battery control system may request a cooperation control so that a DC-DC converter is operated in a constantly ON state in order to detect the fusion of the relay (S110) at the time of driving a vehicle (S100).

Thereafter, the battery control system may control the relay connected to an auxiliary battery to be turned off (S120), and compare an output voltage value Vldc of the DC-DC converter 20 and a summation Vsum of the respective cell voltages of the auxiliary battery (S130).

If the value of Vldc and the value of Vsum are not equal to each other in 'S130' (S140), the battery control system may control the output voltage of the DC-DC converter (S150), and again compare the controlled Vldc and Vsum (S160). As the result of the comparison of 'S160', if Vldc and Vsum are not equal to each other (S170), the battery control system finally may determine that the corresponding relay is normal (S180), and control the relay to be turned on (S190).

Meanwhile, if the value of Vldc and the value of Vsum are equal to each other in 'S140' or 'S170', the battery control system may perform operations after (A) of FIG. 5. If the value of Vldc and the value of Vsum are equal to each other, the battery control system may determine that the fusion has occurred in the relay (S200), and perform a control so that the auxiliary battery maintains a 'HIGH' charged state (S210). In this case, it is possible to reduce a time in which the auxiliary battery is abandoned at the time of starting off the vehicle, or a time when the vehicle is turned off.

Thereafter, if the vehicle enters a starting off operation (S220), the battery control system may output a warning message so that a driver recognizes a fusion state of the relay (S230) and then performs 'S190' of FIG. 4.

Figure 6:
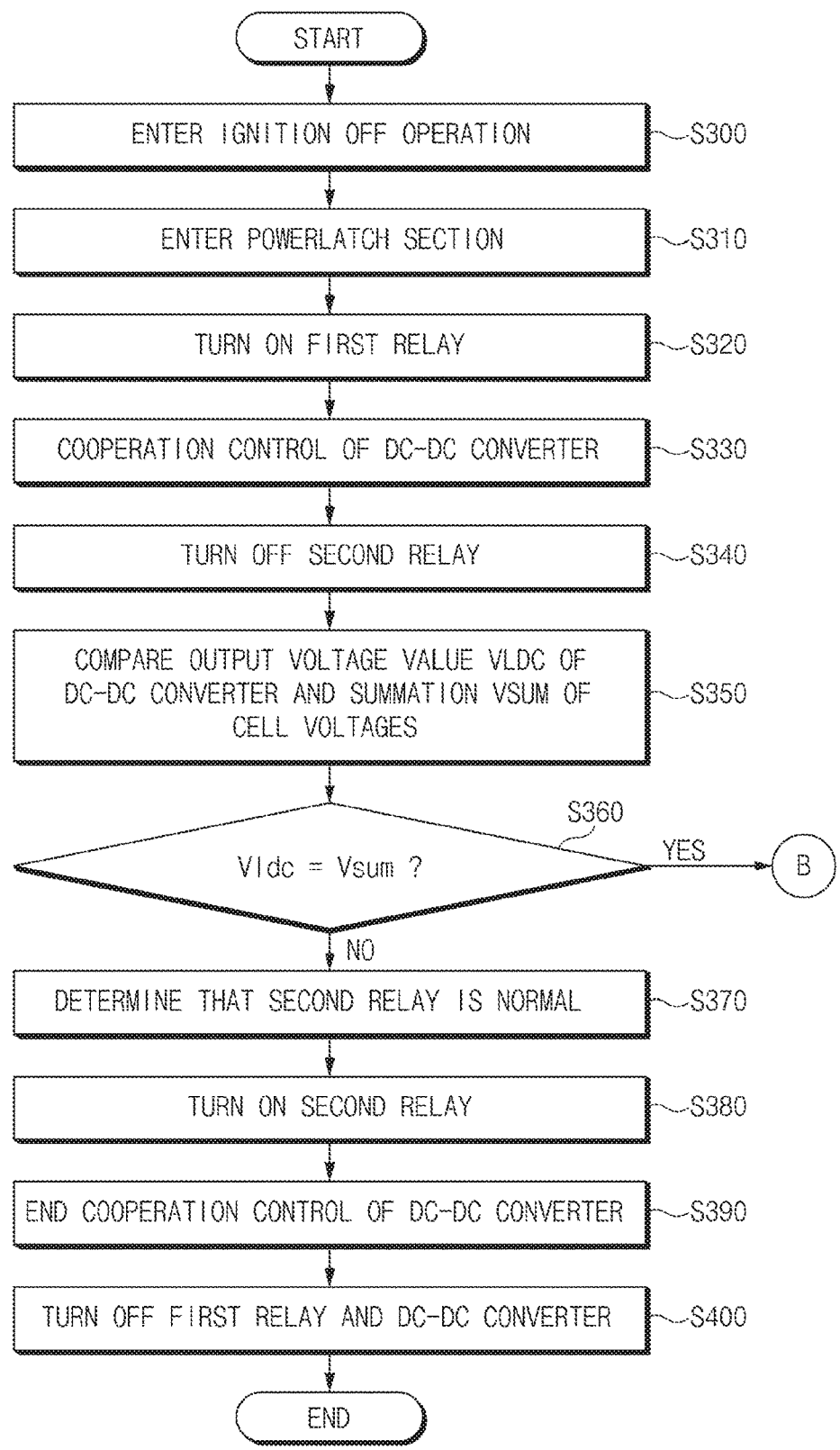
Figure 7:
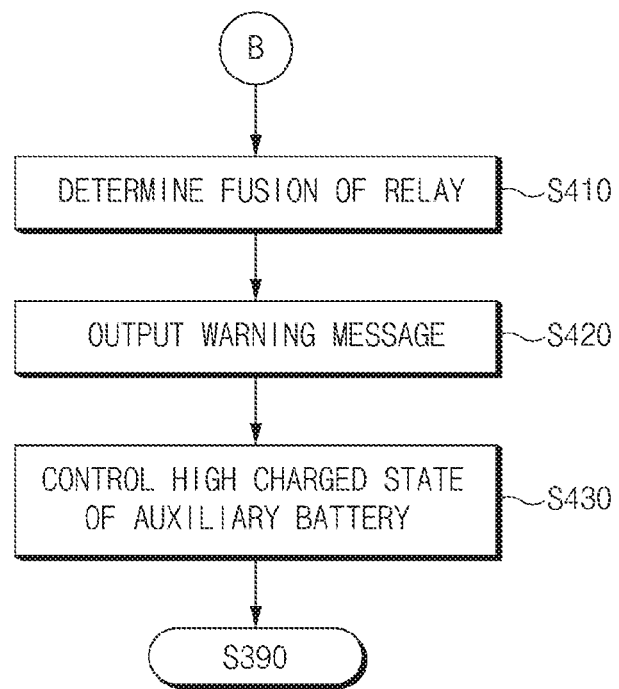

FIGS. 6 and 7 illustrate an operation of detecting a fusion of a relay in a state in which the vehicle enters the starting off operation, or an off state.

Referring to FIGS. 6 and 7, at the time of entering a starting off of the vehicle (S300), if the vehicle enters a powerlatch section for terminating operations of control units of the vehicle (S310), the battery control system may control a first relay connected to the main battery to be turned on so that power supplied to an electronic load is maintained while detecting the fusion of the relay (S320), and request a cooperation control so that a DC-DC converter is operated in a constantly ON state (S330).

Thereafter, the battery control system may control a second relay connected to an auxiliary battery to be turned off (S340), and compare an output voltage value Vldc of the DC-DC converter and a summation Vsum of the respective cell voltages of the auxiliary battery (S350).

If the value of Vldc and the value of Vsum are not equal to each other in 'S350' (S360), the battery control system may determine that the second relay is normal (S370), and control the second relay to be turned on (S380). Thereafter, the battery control system may end the cooperation control of a low power DC-DC converter (S390), and turn off the first relay and the DC-DC converter in order to start off the vehicle (S400), or enter an off state. Here, if the DC-DC converter is turned off, the power may be supplied to the electronic load by the auxiliary battery.

Meanwhile, if the value of Vldc and the value of Vsum are equal to each other in 'S350', the battery control system may perform operations after (B) of FIG. 7. If the value of Vldc and the value of Vsum are equal to each other, the battery control system may determine that the fusion has occurred in the relay (S410), and output a warning message so that the driver may recognize the fusion state of the relay (S420). Therefore, in order to minimize a time in which the auxiliary battery is abandoned at the time of starting off the vehicle, the battery control system may perform a charging of the auxiliary battery, and perform a control so that the charging ends when the auxiliary battery becomes the HIGH charged state (S430).

If the auxiliary battery becomes the HIGH charged state, the battery control system may perform 'S390' of FIG. 6.

As described above, according to exemplary embodiments of the present disclosure, the fusion of the relay may be easily detected by comparing the output voltage of the direct current (DC)-DC converter at the time of starting on or off, or turning off, the vehicle and the summation of the cell voltages of the lithium battery of 12V, and it is possible to prevent a problem that an expensive lithium battery of 12V is over-discharged and replaced due to the fusion of the relay, in advance.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure as claimed in the following claims.

What is claimed is:

1. A battery control system comprising:
a main battery and an auxiliary battery;
a direct current DC-DC converter for converting a high voltage output from the main battery into a low voltage between the main battery and the auxiliary battery and supplying the converted low voltage to the auxiliary battery or an electronic load;
a relay for intermitting a voltage of the auxiliary battery; and
a battery management system for controlling the relay to be turned off in a state in which the DC-DC converter is operated in a constantly ON state, comparing an output voltage of the DC-DC converter and a summation of cell voltages of the auxiliary battery, and detecting a fusion state of the relay according to a comparison result,
wherein when the output voltage of the DC-DC converter and the summation of the cell voltages of the auxiliary battery are equal to each other at the time of driving or starting off a vehicle, the battery management system determines that a fusion has occurred in the relay.

2. The battery control system according to claim 1, wherein when the output voltage of the DC-DC converter and the summation of the cell voltages of the auxiliary battery are not equal to each other at the time of driving vehicle, the battery management system upwardly controls the output voltage of the DC-DC converter and secondly compares the output voltage of the DC-DC converter and the summation of the cell voltages of the auxiliary battery.

3. The battery control system according to claim 2, wherein when the output voltage of the DC-DC converter and the summation of the cell voltages of the auxiliary battery are equal to each other at the result of the secondly comparison, the battery management system determines that a fusion has occurred in the relay, and otherwise determines that the relay is normally operated.

4. The battery control system according to claim 1, wherein when the output voltage of the DC-DC converter and the summation of the cell voltages of the auxiliary battery are not equal to each other at the time of starting off a vehicle, the battery management system determines that the relay is normally operated.

5. The battery control system according to claim 1, wherein at the time of starting off a vehicle, the battery management system upwardly controls the output voltage of the DC-DC converter and then compares the output voltage of the DC-DC converter and the summation of the cell voltages of the auxiliary battery.

6. The battery control system according to claim 1, wherein at the time of starting off a vehicle, the battery management system controls a main relay connected to the main battery to be turned on and then detects the fusion state of the relay.

7. The battery control system according to claim 1, wherein when the fusion of the relay is detected, the battery management system performs a control so that a charged voltage of the auxiliary battery is a predetermined level or more.

8. The battery control system according to claim 1, wherein when the fusion of the relay is detected, the battery management system outputs a warning message that guides the fusion state of the relay, before a starting off of a vehicle is completed.

9. The battery control system according to claim 1, wherein the main battery is a high voltage battery, and the auxiliary battery is a lithium battery of 12V.

10. A method for detecting a fusion of a relay, the method comprising:
   controlling the relay intermitting a voltage of an auxiliary battery to be turned off in a state in which a direct current DC-DC converter supplying a voltage to the auxiliary battery or an electronic load is operated in a constantly ON state;
   comparing an output voltage of the DC-DC converter and a summation of cell voltages of the auxiliary battery; and
   determining that a fusion has occurred in the relay when the output voltage of the DC-DC converter and the summation of the cell voltages of the auxiliary battery are equal to each other.

11. The method according to claim 10, further comprising:
   upwardly controlling the output voltage of the DC-DC converter when the output voltage of the DC-DC converter and the summation of the cell voltages of the auxiliary battery are not equal to each other, as the result of the comparison at the time of driving a vehicle; and
   secondly comparing the output voltage of the DC-DC converter and the summation of the cell voltages of the auxiliary battery.

12. The method according to claim 10, further comprising controlling a main relay connected to a main battery to be turned on before the relay is controlled to be turned off in the step of controlling of the relay to be turned off, at the time of starting off of a vehicle.

13. The method according to claim 10, further comprising upwardly controlling the output voltage of the DC-DC converter before the step of comparing in a state in which the relay is turned off, at the time of starting off of a vehicle.

14. The method according to claim 10, further comprising performing a control so that a charged voltage of the auxiliary battery is a predetermined level or more, after the determining that the fusion has occurred in the relay.

15. The method according to claim 10, further comprising outputting a warning message that guides a fusion state of the relay, after the determining that the fusion has occurred in the relay.

* * * * *